(12) United States Patent
Wang et al.

(10) Patent No.: US 12,165,919 B2
(45) Date of Patent: Dec. 10, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Mengmeng Wang, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 413 days.

(21) Appl. No.: 17/648,541

(22) Filed: Jan. 20, 2022

(65) Prior Publication Data

US 2022/0230916 A1 Jul. 21, 2022

Related U.S. Application Data

(63) Continuation of application No. PCT/CN2021/104797, filed on Jul. 6, 2021.

(30) Foreign Application Priority Data

Jan. 19, 2021 (CN) .......................... 202110068881.0

(51) Int. Cl.
*H01L 21/768* (2006.01)
*H01L 23/538* (2006.01)

(52) U.S. Cl.
CPC .... *H01L 21/76877* (2013.01); *H01L 23/5384* (2013.01)

(58) Field of Classification Search
CPC ........... H01L 21/76877; H01L 23/5384; H01L 21/76807; H01L 21/76816; H01L 23/562; H01L 23/5283; H01L 23/585
See application file for complete search history.

(56) References Cited

U.S. PATENT DOCUMENTS

| | | | |
|---|---|---|---|
| 7,276,440 B2 | 10/2007 | Zhang | |
| 7,453,128 B2 | 11/2008 | Tsutsue | |
| 7,714,413 B2 * | 5/2010 | Morimoto | H01L 21/768 257/762 |
| 9,406,625 B2 | 8/2016 | Wang | |
| 9,673,154 B2 | 6/2017 | Tsutsue et al. | |
| 9,806,119 B2 | 10/2017 | Ho et al. | |
| 10,446,507 B2 * | 10/2019 | Zhu | H01L 23/528 |
| 10,510,792 B2 | 12/2019 | Ho et al. | |
| 2005/0093169 A1 * | 5/2005 | Kajita | H01L 23/562 257/774 |
| 2005/0098893 A1 | 5/2005 | Tsutsue | |
| 2005/0127495 A1 | 6/2005 | Zhang | |

(Continued)

FOREIGN PATENT DOCUMENTS

| | | |
|---|---|---|
| CN | 1617312 A | 5/2005 |
| CN | 104779243 A | 7/2015 |

(Continued)

*Primary Examiner* — Allison Bernstein
(74) *Attorney, Agent, or Firm* — Syncoda LLC; Feng Ma

(57) ABSTRACT

A manufacturing method of a semiconductor structure includes: a substrate is provided; and an intermediate layer is formed on the substrate, an I-shaped member and a wall-shaped member are formed in the intermediate layer, a top surface of the wall-shaped member is not lower than a top surface of the I-shaped member, and a bottom surface of the wall-shaped member is not higher than a bottom surface of the I-shaped member.

20 Claims, 16 Drawing Sheets

(56) References Cited

U.S. PATENT DOCUMENTS

| | | | |
|---|---|---|---|
| 2015/0194455 A1 | 7/2015 | Ho et al. | |
| 2015/0371957 A1 | 12/2015 | Wang | |
| 2018/0033817 A1 | 2/2018 | Ho et al. | |
| 2020/0119074 A1 | 4/2020 | Ho et al. | |
| 2022/0310484 A1* | 9/2022 | Yang | H01L 23/585 |
| 2023/0163084 A1* | 5/2023 | Ku | H01L 23/585 257/774 |

FOREIGN PATENT DOCUMENTS

| | | |
|---|---|---|
| CN | 105448866 A | 3/2016 |
| CN | 108962873 A | 12/2018 |
| CN | 112885778 A | 6/2021 |
| JP | 2000277465 A | 10/2000 |

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/104797 filed on Jul. 6, 2021, which claims priority to Chinese Patent Application No. 202110068881.0 filed on Jan. 19, 2021. The disclosures of these applications are hereby incorporated by reference in their entirety.

BACKGROUND

In a manufacturing process of a semiconductor, a semiconductor structure, for example a chip, can be formed on a semiconductor substrate through processes of photoetching, etching, deposition, etc. The formed chip generally includes a semiconductor device and an interconnection structure disposed on the semiconductor device.

SUMMARY

Embodiments of the present disclosure relate to the technical field of semiconductors, and more specifically to a semiconductor structure and a manufacturing method thereof.

An embodiment of the present disclosure provides a semiconductor structure and a manufacturing method thereof for improving the reliability of the semiconductor structure.

According to some embodiments, in a first aspect, the present disclosure provides a manufacturing method of a semiconductor structure, the method includes a substrate is provided; and an intermediate layer is formed on the substrate. An I-shaped member and a wall-shaped member are formed in the intermediate layer, a top surface of the wall-shaped member is not lower than a top surface of the I-shaped member, and a bottom surface of the wall-shaped member is not higher than a bottom surface of the I-shaped member.

According to some embodiments, in a second aspect, the present disclosure further provides a semiconductor structure including a substrate; an intermediate layer disposed on the substrate; and an I-shaped member and a wall-shaped member, disposed in the intermediate layer. A top surface of the wall-shaped member is not lower than a top surface of the I-shaped member, and a bottom surface of the wall-shaped member is not higher than a bottom surface of the I-shaped member.

Besides the technical problems solved by the embodiments of the present disclosure, the technical features constituting the technical solutions and the beneficial effects brought by the technical features of these technical solutions described above, other technical problems capable of being solved by the semiconductor structure and the manufacturing method thereof provided by the embodiments of the present disclosure, other technical features contained in the technical solutions and the beneficial effects brought by these technical features will be further illustrated in detail in the detailed description.

DETAILED DESCRIPTION

Multiple chips can be formed on the semiconductor substrate, and these chips are cut down from the semiconductor substrate and are packaged to form multiple individual chips. In a process of cutting these chips, stress generated by a cutting tool may damage an edge of the chip, resulting in collapse or fracture of the chip, so that chip failure is caused, and a decrease in reliability of the semiconductor structure is caused. Additionally, water vapor or other gases and liquids are easy to seep from a side surface to cause erosion and damage to the chip, resulting in chip failure, and the reliability of the semiconductor structure is further reduced.

An embodiment of the present disclosure provides a semiconductor structure and a manufacturing method thereof. A height of a wall-shaped member is greater than or equal to a height of an I-shaped member, so that the I-shaped member is disposed inside the wall-shaped member, thus reducing or preventing stress expansion from a side surface to the I-shaped member or gas and liquid erosion on the I-shaped member from the side surface, so that the I-shaped member failure is reduced or avoided, and the reliability of the semiconductor structure is improved.

In order that the above objects, features and advantages of the embodiments of the present disclosure may be more readily understood, the technical solutions in the embodiments of the present disclosure will be clearly and completely described in conjunction with drawings in the embodiments of the present disclosure. It is apparent that the described embodiments are only a portion of the embodiments of the present disclosure and not all embodiments. Based on the embodiments in the present disclosure, all other embodiments obtained by a person skilled in the art without any inventive effort fall within the protection scope of the present disclosure.

Figure 1:
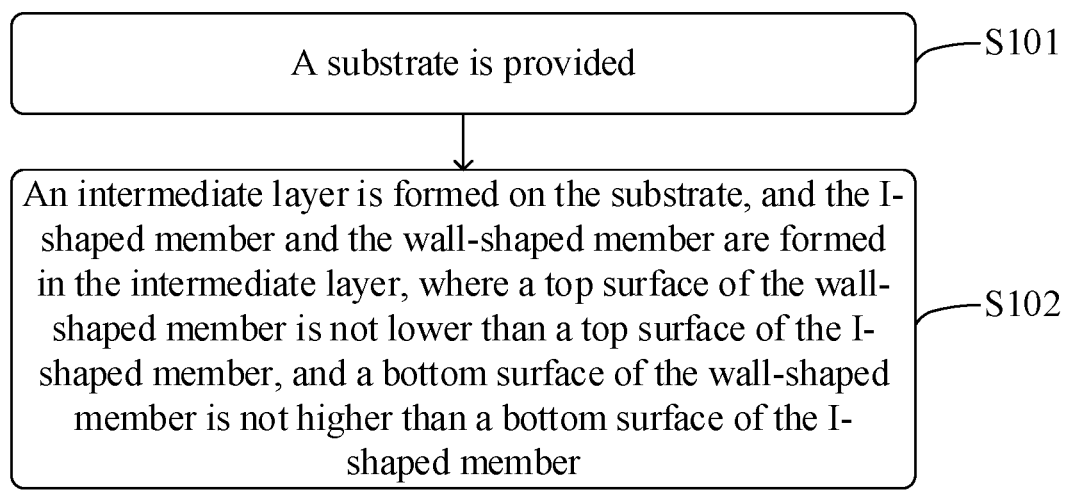
FIG. 1 illustrates a flowchart of a manufacturing method for a semiconductor structure according to an embodiment of the present disclosure.

Referring to FIG. 1, FIG. 1 illustrates a flowchart of a manufacturing method for a semiconductor structure according to an embodiment of the present disclosure. The manufacturing method specifically includes S101 to S102.

In S101, a substrate is provided.

Figure 2:
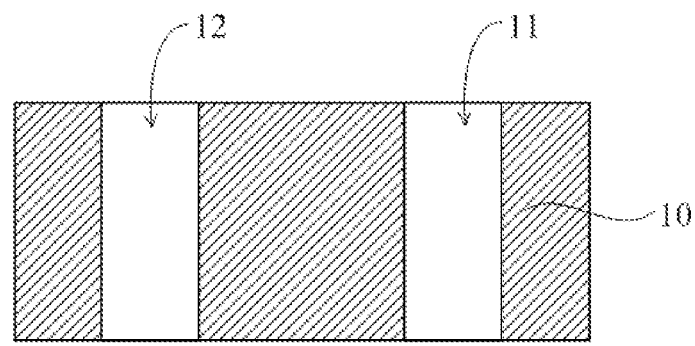
FIG. 2 illustrates a schematic structure diagram after a first through hole and a second through hole are formed according to an embodiment of the present disclosure.
Figure 3:
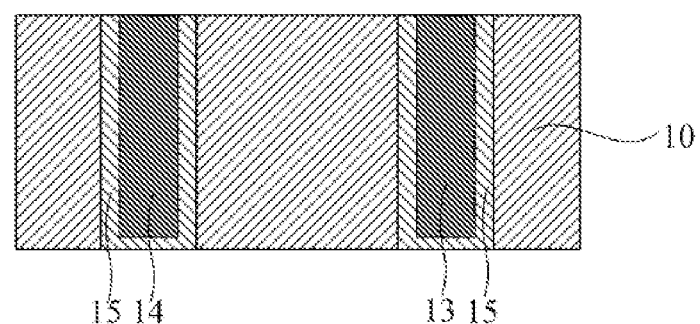
FIG. 3 illustrates a flowchart of forming an upper portion and a middle portion of an I-shaped member and a wall-shaped member in the same operation according to an embodiment of the present disclosure.

Referring to FIG. 2 and FIG. 3, a first contact structure 13 and a second contact structure 14 may be formed in the substrate 10. An interval is formed between the first contact structure 13 and the second contact structure 14. The first contact structure 13 and the second contact structure 14 can be connected with an active region, i.e., the first contact structure 13 and the second contact structure 14 communicate with the active region, and both materials thereof may be conduction materials, such as metal tungsten (W).

It should be noted that a second blocking layer 15 may be disposed on a surface of each of the first contact structure 13 and the second contact structure 14. Exemplarily, the second blocking layers 15 are respectively disposed on side surfaces and bottom surfaces of the first contact structure 13 and the second contact structure 14, and are configured to prevent materials of the first contact structure 13 and the second contact structure 14 from being diffused into the substrate 10. A material of the second blocking layer 15 may be titanium (Ti) or titanium nitride (TiN), etc.

In some possible embodiments, the substrate 10 may be manufactured by the following method.

A silicon wafer is provided, a dielectric layer is formed on the silicon wafer, a material of the dielectric layer includes any one or a free combination of materials required by a common semiconductor manufacturing process of silicon dioxide, silicon nitride, silicon oxynitride or polycrystalline silicon, etc.

Then, the dielectric layer is treated by processes such as photoetching and etching, a first through hole 11 and a second through hole 12 are formed in the dielectric layer, and the substrate 10 with the first through hole 11 and the second through hole 12 as shown in FIG. 2 is formed.

Then, the second blocking layer 15 and a conduction material are respectively formed in each of the first through hole 11 and the second through hole 12, so as to form the first contact structure 13 and the second contact structure 14 as shown in FIG. 3.

In S102, an intermediate layer is formed on the substrate, and the I-shaped member and the wall-shaped member are formed in the intermediate layer. The top surface of the wall-shaped member is not lower than the top surface of the I-shaped member, and the bottom surface of the wall-shaped member is not higher than the bottom surface of the I-shaped member.

Figure 10:
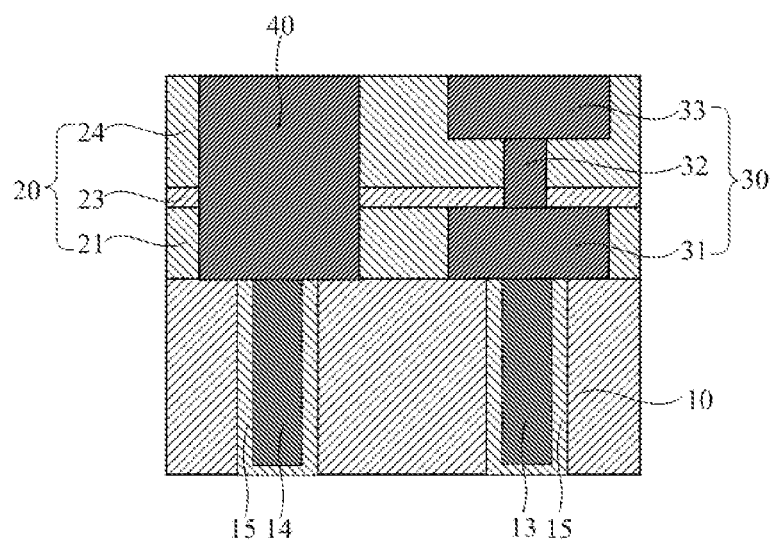
FIG. 10 illustrates a schematic structure diagram after a wall-shaped member and an I-shaped member are formed according to an embodiment of the present disclosure.

As shown in FIG. 10, the intermediate layer 20 may include a first dielectric layer 21 and a second dielectric layer 24. The I-shaped member 30 may include an upper portion, a middle portion and a bottom portion. The upper portion 33 of the I-shaped member and the middle portion 32 of the I-shaped member are disposed in the second dielectric layer 24, a bottom portion 31 of the I-shaped member is disposed in the first dielectric layer 21, and the wall-shaped member 40 is disposed in the first dielectric layer and the second dielectric layer.

Optionally, the wall-shaped member 40 is integrally formed. It can be underground that the integrally formed wall-shaped member 40 may be completed in a one-step process step. Specifically, an opening may be formed in the intermediate layer, and the wall-shaped member 40 is formed in the opening through a one-step deposition process or a one-step electroplating process. A material of the wall-shaped member 40 includes conduction materials such as copper, cobalt and tungsten. The integrally formed wall-shaped member 40 cannot easily generate interlayer separation, i.e., the integrally formed wall-shaped member 40 has a more stable and firmer structure, and separation of each portion can be avoided, so that the blocking capability of the wall-shaped member 40 on gas and liquid or other gases and liquids is improved, and the reliability of the semiconductor structure is further improved.

Optionally, the upper portion 33 of the I-shaped member and the middle portion 32 of the I-shaped member and the wall-shaped member 40 are formed in the same step. That is, the upper portion 33 of the I-shaped member and the middle portion 32 of the I-shaped member are completed in a one-step process step and are formed simultaneously with the wall-shaped member 40. Therefore, the process steps can be simplified, and the process cost is reduced.

Optionally, the operation that the upper portion 33 of the I-shaped member and the middle portion 32 of the I-shaped member and the wall-shaped member 40 are formed in the same step specifically includes the following operations.

Figure 4:
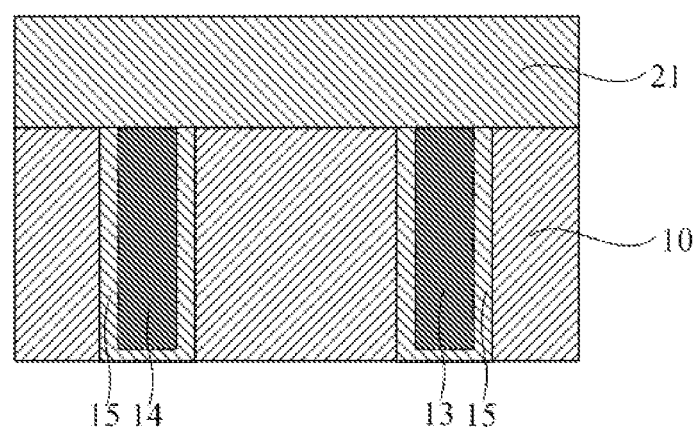
FIG. 4 illustrates a schematic structure diagram after a first dielectric layer is formed according to an embodiment of the present disclosure.

Referring to FIG. 4 to FIG. 10, a first dielectric layer 21 is formed on the substrate 10, the first dielectric layer 21 may be formed by adopting a deposition process such as Chemical Vapor Deposition (CVD) or Physical Vapor Deposition (PVD). As shown in FIG. 4, the first dielectric layer 21 may cover the first contact structure 13 and the second contact structure 14. A material of the first dielectric layer 21 includes but is not limited to any one or a free combination of materials such as silicon oxide, silicon nitride, silicon oxynitride and Low-K.

Figure 5:
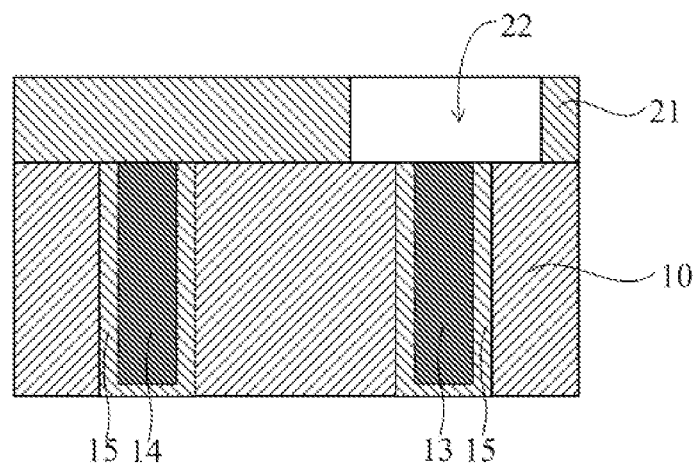
FIG. 5 illustrates a schematic structure diagram after a third opening is formed according to an embodiment of the present disclosure.
Figure 6:
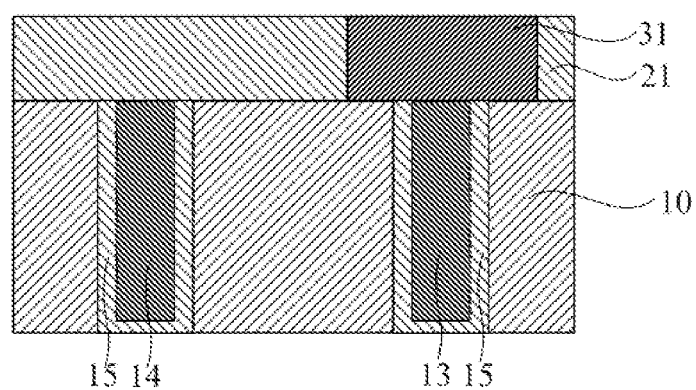
FIG. 6 illustrates a schematic structure diagram after a bottom portion of the I-shaped member is formed according to an embodiment of the present disclosure.

After the first dielectric layer 21 is formed, a bottom portion 31 of the I-shaped member is formed in the first dielectric layer 21. Specifically, as shown in FIG. 5 and FIG. 6, a third opening 22 is formed in the first dielectric layer 21. For example, the third opening 22 is formed in the first dielectric layer 21 through photoetching process and etching process, and the third opening 22 is filled with a metal material through a deposition process or electroplating process to form the bottom portion 31 of the I-shaped member.

Specifically, the third opening 22 may be formed through dry etching, for example, may be formed through plasma etching. As shown in FIG. 5, the third opening 22 exposes the first contact structure 13, and the bottom portion 31 of the I-shaped member is formed in the third opening 22. As shown in FIG. 6, the bottom portion 31 of the I-shaped member is connected with the first contact structure 13, so that the bottom portion 31 of the I-shaped member conducts with the first contact structure 13.

A material of the bottom portion 31 of the I-shaped member may be a metal material such as tungsten, cobalt, aluminum, copper, aluminum alloy or copper alloy. Exemplarily, when the material of the bottom portion 31 of the I-shaped member is copper, copper may be formed through an Electrochemical Plating (ECP) process, so that the third opening 22 is filled with copper so as to form the bottom portion 31 of the I-shaped member.

It should be noted that after the bottom portion 31 of the I-shaped member is formed, the first dielectric layer 21 and the surface of the bottom portion 31 of the I-shaped member can be subjected to planarization treatment. For example, through a chemical mechanical polishing process, the first dielectric layer 21 and the upper surface of the bottom portion 31 of the I-shaped member are polished, i.e., the upper surface of the structure shown in FIG. 6 is polished so as to improve the flatness and ensure the quality of other layers formed on the first dielectric layer 21 and the bottom portion 31 of the I-shaped member.

Figure 7:
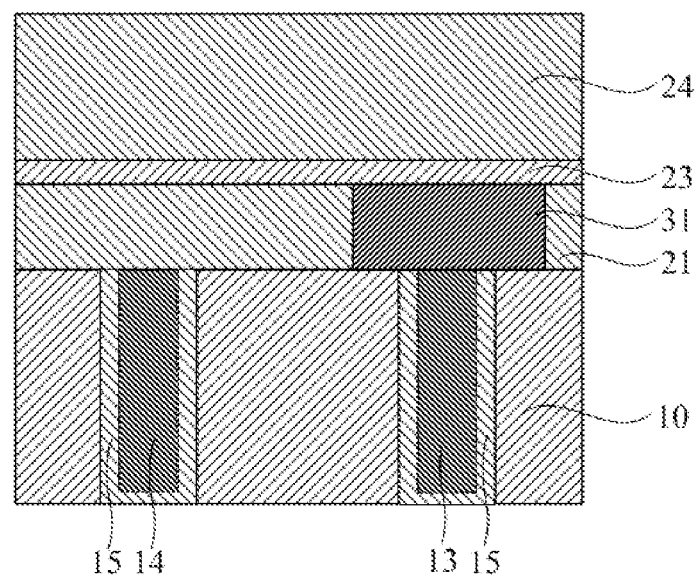
FIG. 7 illustrates a schematic structure diagram after a second dielectric layer is formed according to an embodiment of the present disclosure.

After the bottom portion 31 of the I-shaped member is formed, a second dielectric layer 24 is formed on the first dielectric layer 21 and the bottom portion 31 of the I-shaped member. Referring to FIG. 7, the second dielectric layer 24 may be formed by a deposition process such as CVD process or PVD process. A material of the second dielectric layer 24 includes but is not limited to any one or a free combination of materials such as silicon oxide, silicon nitride, silicon oxynitride and Low-K.

Optionally, a material of the first dielectric layer 21 is the same as a material of the second dielectric layer 24. Through such arrangement, a subsequent process step of forming a first opening 27 and a second opening 28 can be simplified, and the manufacturing difficulty and the manufacturing cost are reduced.

Figure 8:
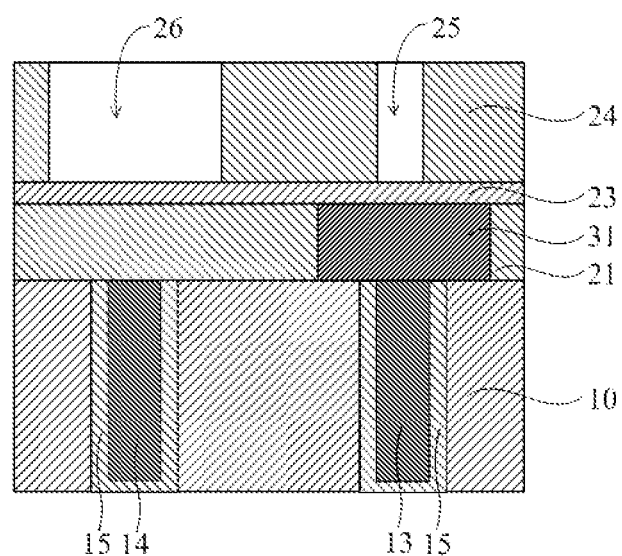
FIG. 8 illustrates a schematic structure diagram after a first initial opening and a second initial opening are formed according to an embodiment of the present disclosure.

After the second dielectric layer 24 is formed, the first opening 27 and the second opening 28 are respectively formed in the second dielectric layer 24. The first opening 27 exposes the bottom portion 31 of the I-shaped member, and the second opening 28 penetrates through the second dielectric layer 24 and extends to the first dielectric layer 21, as shown in FIG. 8.

Specifically, a first photoresist layer with a first pattern and a second pattern may be formed on the second dielectric layer 24. The second dielectric layer 24 is etched by using the first pattern and the second pattern to respectively form a first initial opening 25 and a second initial opening 26. An opening dimension of the first initial opening 25 can be smaller than an opening dimension of the second initial opening 26. The first photoresist layer is removed. A second photoresist layer with a third pattern is formed on the second dielectric layer 24 with the first initial opening 25 and the second initial opening 26, the third pattern exposes the first initial opening 25 and a part of the second dielectric layer 24, and the fourth pattern exposes the second initial opening 26. That is, an opening dimension of the third pattern is greater than an opening dimension of the first initial opening 25. Specifically, the second photoresist layer is formed on the second dielectric layer 24 by using a spin coating process. The first initial opening 25 and the second initial opening 26 are filled with the second photoresist layer. Through exposure and development, the photoresist layer in the first initial opening 25 and the second initial opening 26 is removed, and at the same time the third pattern and the fourth pattern are respectively formed above the first initial opening 25 and the second initial opening 26. The opening dimension of the third pattern is greater than the opening dimension of the first initial opening 25, additionally, the third pattern exposes the first initial opening 25 and a part of the second dielectric layer 24, the fourth pattern exposes the second initial opening 26, and the opening dimension of the fourth pattern is equal to the opening dimension of the second initial opening 26. The second dielectric layer 24 and the first dielectric layer 21 are respectively etched simultaneously by using the third pattern and the fourth pattern to form the first opening 27 and the second opening 28. Specifically, the second dielectric layer 24 on the periphery of the first initial opening 25 and the first dielectric layer 21 at the bottom of the second initial opening 26 may be etched simultaneously by using a dry etching process to respectively form the first opening 27 and the second opening 28.

Figure 9:
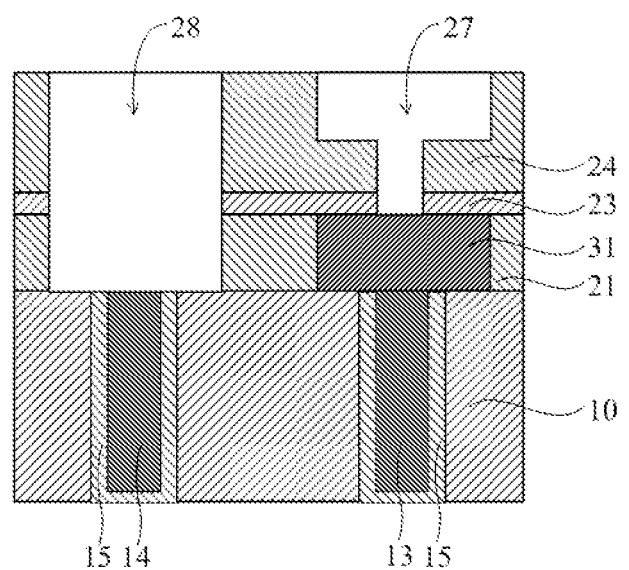
FIG. 9 illustrates a schematic structure diagram after a first opening and a second opening are formed according to an embodiment of the present disclosure.

As shown in FIG. 9, the first opening 27 may be provided with a T-shaped structure, the first opening 27 exposes the bottom portion 31 of the I-shaped member, the first opening 27 is configured to form the middle portion 32 of the I-shaped member in contact with the bottom portion 31 of the I-shaped member and the upper portion 33 of the I-shaped member. The second opening 28 penetrates through the second dielectric layer 24 and the first dielectric layer 21, and the second opening 28 is configured to form the wall-shaped member 40. The first opening 27 and the second opening 28 are formed through etching simultaneously to form a structure as shown in FIG. 9, thus reducing the manufacturing steps of the semiconductor structure and improving the efficiency.

After the first opening 27 and the second opening 28 are formed, the middle portion 32 of the I-shaped member and the upper portion 33 of the I-shaped member are formed in the first opening 27. At the same time, the wall-shaped member 40 is formed in the second opening 28. Specifically, the first opening 27 and the second opening 28 may be filled with the conduction material at the same time by using the deposition process or the electroplating process to respectively form the middle portion 32 of the I-shaped member and the upper portion 33 of the I-shaped member and the wall-shaped member 40. That is, the first opening 27 is filled with the conduction material to form the middle portion 32 of the I-shaped member and the upper portion 33 of the I-shaped member, and the second opening 28 is filled with the conduction material to form the wall-shaped member 40.

Optionally, the substrate 10 includes a chip region and a periphery region, and the I-shaped member 30 and the wall-shaped member 40 are respectively disposed in the chip region and the periphery region. Specifically, the wall-shaped member 40 may be a portion of a guard ring or seal ring of the chip. The I-shaped member 30 may be a conduction interconnection structure in the chip region. Specifically, a width of the upper portion 33 of the I-shaped member is greater or equal to a width of the bottom portion 31 of the I-shaped member, a width of the middle portion 32 of the I-shaped member is the smallest, and the upper portion 33 of the I-shaped member, the middle portion 32 of the I-shaped member and the bottom portion 31 of the I-shaped member form the I-shaped member 30. The middle portion 32 of the I-shaped member is connected with the bottom portion 31 of the I-shaped member. For example, the middle portion 32 of the I-shaped member is in contact with the bottom 31 of the I-shaped member, so that the I-shaped member 30 is conducted with the first contact structure 13.

The wall-shaped member 40 may be connected with the second contact structure 14 so that the wall-shaped member 40 is connected with the second contact structure 14, to form a tight protection structure. A cross section shape of the wall-shaped member 40 may be in a rectangular shape, a width of the wall-shaped member 40 is greater than a width of the middle portion 32 of the I-shaped member. For example, the width of the wall-shaped member 40 may be equal to a width of the upper portion 33 of the I-shaped member, the manufacturing difficulty of the first opening 27 and the second opening 28 can be simplified, and the manufacturing quality of the first opening 27 and the second opening 28 is improved. The width of the wall-shaped member 40 may be identical at the upper and lower sides, that is, the wall thickness of the wall-shaped member 40 is consistent, and is greater than the width of the middle portion 32 of the I-shaped member, so that the protection performance on the I-shaped member 30 can be further improved, and the reliability of the semiconductor structure can be improved.

Optionally, the wall-shaped member 40 surrounds the I-shaped member 30, and the height of the wall-shaped member 40 is greater than or equal to the height of the I-shaped member 30. The height of the wall-shaped member 40 herein may be understood as the length of the wall-shaped member 40 in a direction along the surface of the substrate 10. The height of the I-shaped member 30 herein may be understood as the length of the I-shaped member 30 in a direction along the surface of the substrate 10. Exemplarily, a top surface of the wall-shaped member 40 may be flushed with a top surface of the I-shaped member 30, and a bottom surface of the wall-shaped member 40 is not higher than a bottom surface of the I-shaped member 30, so that the I-shaped member 30 is disposed at the inner side of the wall-shaped member 40 so as to ensure a protection effect of the wall-shaped member 40.

The wall-shaped member 40 may penetrate through the intermediate layer 20, and a bottom surface of the wall-shaped member 40 may be connected with the second contact structure 14 in the periphery region. For example, the bottom surface of the wall-shaped member 40 is in contact with the top surface of the second contact structure 14. The bottom surface of the wall-shaped member 40 completely covers the top surface of the second contact structure 14, that is, a positive projection of the wall-shaped member 40 on the substrate 10 covers a positive projection of the second contact structure 14 on the substrate 10, so that the wall-shaped member 40 has a larger contact area, and the reliable connection between the wall-shaped member 40 and the second contact structure 14 is ensured.

The bottom surface of the I-shaped member 30 may be connected with the first contact structure 13 in the chip region. For example, the bottom surface of the I-shaped member 30 is in contact with the top surface of the first contact structure 13. Through such arrangement, the I-shaped member 30 may be conducted with the first contact structure 13. In the embodiment of the present disclosure, the bottom surface of the I-shaped member 30 covers the top surface of the first contact structure 13 so that a greater contact area is realized between the first contact structure 13 and the I-shaped member 30, and the reliable connection between the first contact structure 13 and the I-shaped member 30 is ensured.

A width of the middle portion 32 of the I-shaped member is the smallest, and a width of the upper portion 33 of the I-shaped member is greater than or equal to a width of the bottom portion 31 of the I-shaped member, so that the upper portion 33 of the I-shaped member has a greater contact area. Therefore, when other connecting members are disposed on the I-shaped member 30, the reliable connection between the I-shaped member and the other connecting members is ensured.

It should be noted that materials of the wall-shaped member 40 and the I-shaped member 30 may be metal materials. In order to prevent the wall-shaped member 40 and the I-shaped member 30 from diffusing to the periphery, the side surfaces and the bottom surface of each of the wall-shaped member 40 and the I-shaped member 30 may be provided with a first blocking layer, and the first blocking layer may be a titanium layer or a titanium nitride (TiN) layer. After the wall-shaped member 40 and the I-shaped member 30 are formed, the second dielectric layer 24, the wall-shaped member 40 and the I-shaped member 30 are subjected to planarization treatment. For example, the upper surface of the structure as shown in FIG. 10 is subjected to planarization treatment through a CMP process.

In the embodiments of the present disclosure, before the operation of forming the second dielectric layer 24 on the first dielectric layer 21, the manufacturing method of the semiconductor structure further includes: a first etching stop layer 23 is formed on the first dielectric layer 21, and the first etching stop layer 23 covers the bottom portion 31 of the I-shaped member. The first etching stop layer 23 may be a silicon nitride layer, and the second dielectric layer 24 is formed on the first etching stop layer 23.

In the embodiments of the present disclosure, after the intermediate layer 20 is formed, the manufacturing method of the semiconductor structure further includes the following operations.

A third dielectric layer 50 is formed on the intermediate layer 20, a third contact structure 51 and a fourth contact structure 52 penetrating through the third dielectric layer 50 are formed in the third dielectric layer 50. The third contact structure 51 is connected with the upper portion 33 of the I-shaped member, the fourth contact structure 52 is connected with the wall-shaped member 40, and the fourth contact structure 52 surrounds the third contact structure 51.

In order to prevent the damage to the intermediate layer 20 when the third contact structure 51 and the fourth contact structure 52 are formed, a second etching stop layer 60 is further formed between the intermediate layer 20 and the third dielectric layer 50.

Figure 11:
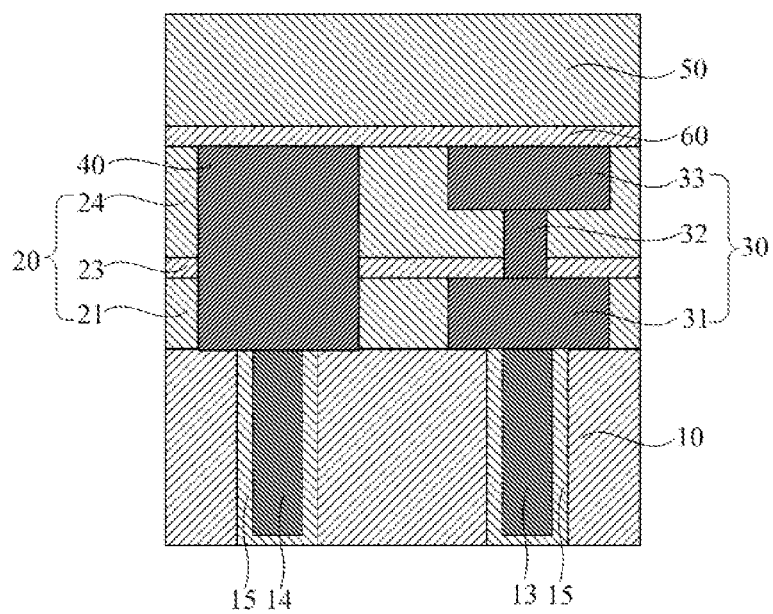
FIG. 11 illustrates a schematic structure diagram after a third dielectric layer is formed according to an embodiment of the present disclosure.

In a possible example, firstly, the second etching stop layer 60 is formed on the intermediate layer 20 through deposition, and the second etching stop layer 60 covers the wall-shaped member 40 and the I-shaped member 30. Then, the third dielectric layer 50 is formed on the second etching stop layer 60 through deposition. As shown in FIG. 11, the intermediate layer 20, the second etching stop layer 60 and the third dielectric layer 50 are sequentially disposed from bottom to top. A material of the second etching stop layer 60 may be silicon nitride, and a material of the third dielectric layer 50 may be silicon oxide.

Figure 12:
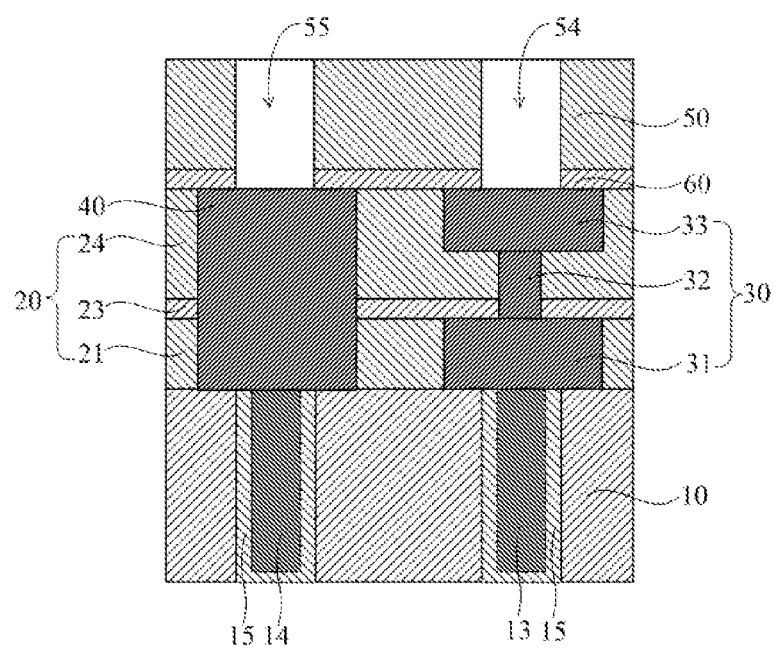
FIG. 12 illustrates a schematic structure diagram after a third through hole and a fourth through hole are formed according to an embodiment of the present disclosure.

After the third dielectric layer 50 is formed, the second etching stop layer 60 and the third dielectric layer 50 are etched to form a third through hole 54 extending to the I-shaped member 30 and a fourth through hole 55 extending to the wall-shaped member 40. As shown in FIG. 12, the I-shaped member 30 is exposed in the third through hole 54, and the wall-shaped member 40 is exposed in the fourth through hole 55. That is, the third through hole 54 and the fourth through hole 55 penetrate through the second etching stop layer 60 and the third dielectric layer 50.

Figure 13:
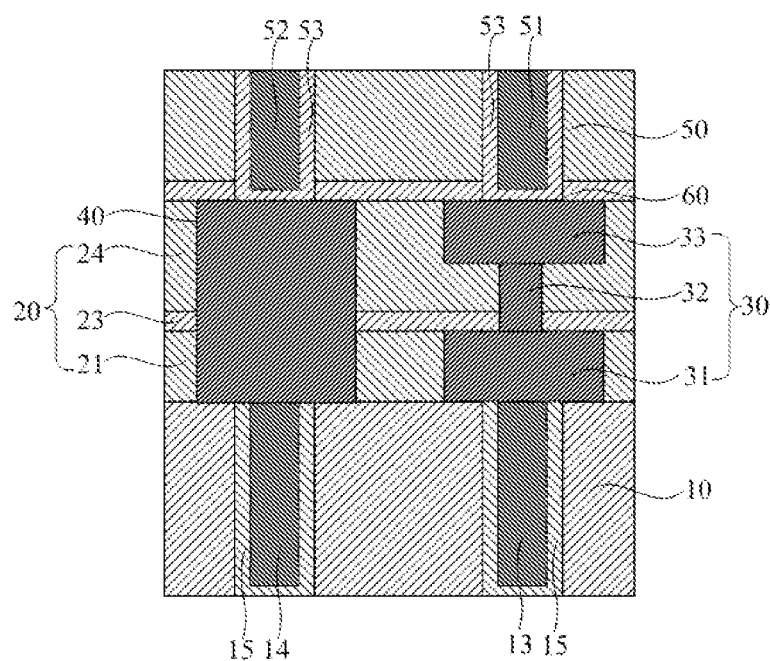
FIG. 13 illustrates a schematic structure diagram after a third contact structure and a fourth contact structure are formed according to an embodiment of the present disclosure.

After the third through hole 54 and the fourth through hole 55 are formed, the conduction material is respectively deposited in the third through hole 54 and the fourth through hole 55 to form the third contact structure 51 and the fourth contact structure 52, and as shown in FIG. 13, the third contact structure 51 is connected with the I-shaped member 30, and the fourth contact structure 52 is connected with the wall-shaped member 40.

Referring to FIG. 13, a material of the third contact structure 51 and the fourth contact structure 52 may be tungsten or tungsten alloy, and the third blocking layer 53 is further formed on the side surfaces and the bottom surface of each of the third contact structure 51 and the fourth contact structure 52 so as to prevent the diffusion into the third dielectric layer 50.

Exemplarily, the third blocking layer 53 is firstly formed in the inner surface of each of the third through hole 54 and the fourth through hole 55 through deposition, the formed third blocking layer 53 is provided with a second middle hole, then, a conduction material is deposited in the second middle hole to form the third contact structure 51 corresponding to the I-shaped member 30 and the fourth contact structure 52 corresponding to the wall-shaped member 40.

In the embodiments of the present disclosure, after the third dielectric layer 50 is formed on the intermediate layer 20, the manufacturing method of the semiconductor structure further includes the following operations.

Figure 14:
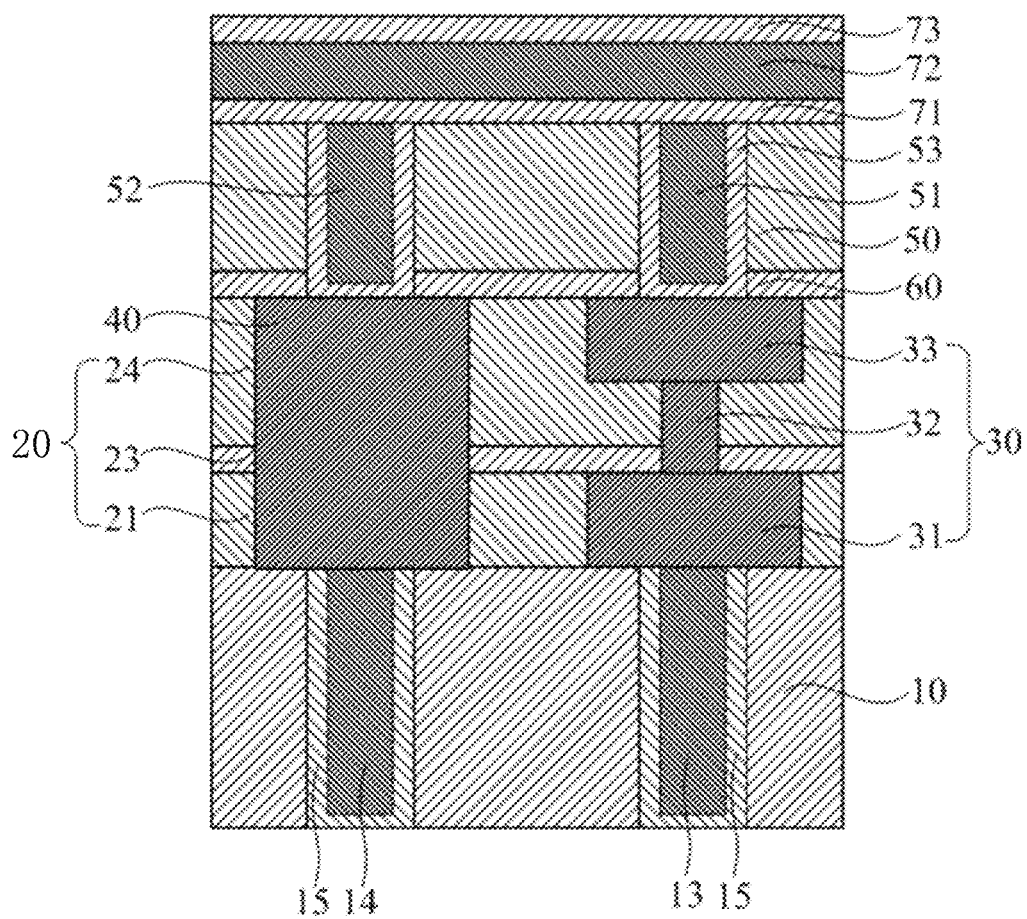
FIG. 14 illustrates a schematic structure diagram after a conduction layer is formed according to an embodiment of the present disclosure.

A conduction layer is formed on the third dielectric layer 50. Exemplarily, as shown in FIG. 14, the conduction layer includes a fourth blocking layer 71, a metal layer 72 and a fifth blocking layer 73, and the fourth blocking layer 71, the metal layer 72 and the fifth blocking layer 73 may be sequentially formed on the third dielectric layer 50 through deposition. Materials of the fourth blocking layer 71 and the fifth blocking layer 73 may be titanium or titanium nitride, and a material of the metal layer 72 may be aluminum or aluminum alloy.

Figure 15:
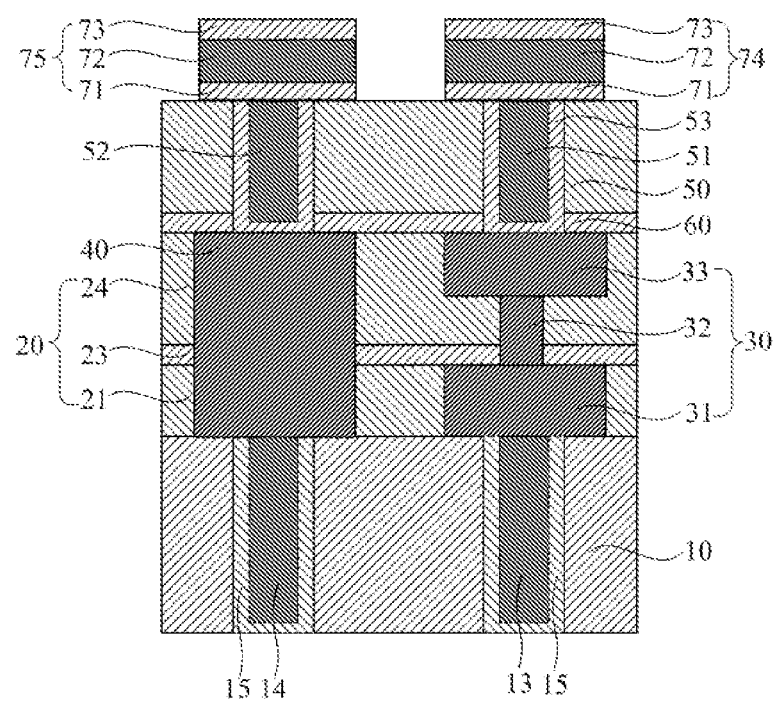
FIG. 15 illustrates a schematic structure diagram after a first connecting line and a second connecting line are formed according to an embodiment of the present disclosure.

Then, a part of the conduction layer is removed, the remained conduction layer corresponding to the third contact structure 51 forms a first connecting line 74, the remained conduction layer corresponding to the fourth contact structure 52 forms a second connecting line 75, and as shown in FIG. 15, the first connecting line 74 and the second connecting line 75 have an interval.

The first connecting line 74 is conducted with the third contact structure 51, and the second connecting line 75 is conducted with the fourth contact structure 52. For example, the first connecting line 74 is in contact with the third contact structure 51, and the second connecting line 75 is in contact with the fourth contact structure 52.

Figure 16:
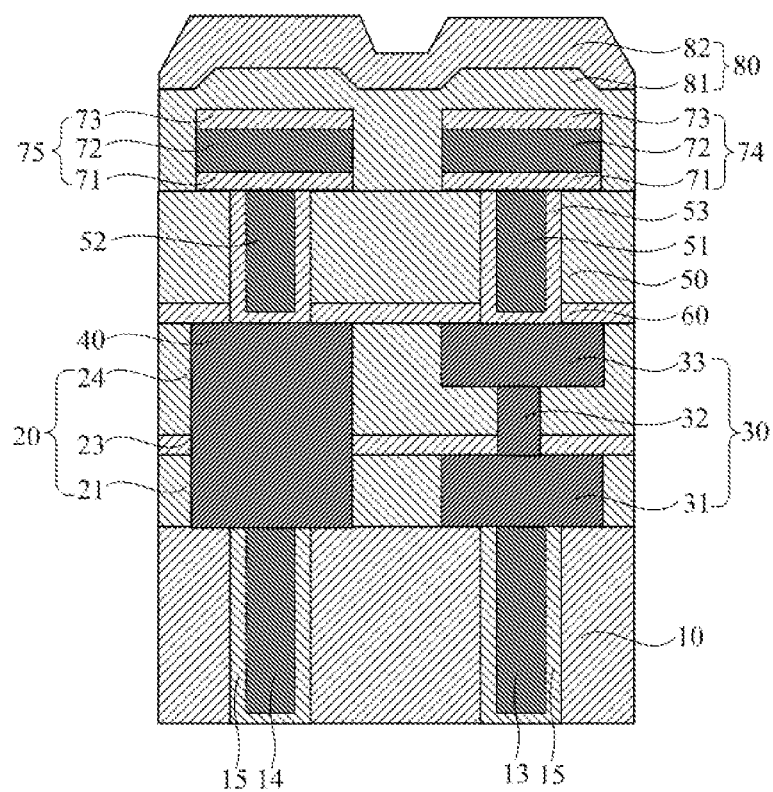
FIG. 16 illustrates a schematic structure diagram after a protection layer is formed according to an embodiment of the present disclosure.

Finally, a protection layer 80 is formed on the third dielectric layer 50, and the protection layer 80 covers the first connecting line 74 and the second connecting line 75, as shown in FIG. 16. Exemplarily, a silicon oxide layer 81 is firstly formed on the third dielectric layer 50 through deposition, and the silicon oxide layer 81 covers the first connecting line 74 and the second connecting line 75. A silicon nitride layer 82 is then formed on the silicon oxide layer 81 through deposition, and the protection layer 80 consisting of the silicon oxide layer 81 and the silicon nitride layer 82 is configured to prevent the first connecting line 74 and the second connecting line 75 from being damaged.

Referring to FIG. 16, the semiconductor structure in the embodiments of the present disclosure includes the substrate 10, the intermediate layer 20 disposed on the substrate 10, and the I-shaped member 30 and the wall-shaped member 40 disposed in the intermediate layer 20. The top surface of the wall-shaped member 40 is not lower than the top surface of the I-shaped member 30, and the bottom surface of the wall-shaped member 40 is not higher than the surface of the I-shaped member 30.

Optionally, the top surface of the wall-shaped member 40 is flushed with the top surface of the I-shaped member 30.

Optionally, the upper portion 33 of the I-shaped member and the middle portion 33 of the I-shaped member are integrally formed, and the wall-shaped member 40 is integrally formed.

Optionally, the intermediate layer 20 includes the first dielectric layer 21 and the second dielectric layer 24. The upper portion 33 of the I-shaped member and the middle portion 32 of the I-shaped member are disposed in the second dielectric layer 24, the lower portion 31 of the I-shaped member is disposed in the first dielectric layer 21, and the wall-shaped member 40 is disposed in the second dielectric layer 24 and the first dielectric layer 21.

Optionally, the width of the wall-shaped member 40 is greater than the width of the middle portion 32 of the I-shaped member.

Optionally, the width of the wall-shaped member 40 is equal to the width of the upper portion 33 of the I-shaped member, and the width of the upper portion 33 of the I-shaped member is not smaller than the width of the bottom portion 31 of the I-shaped member.

Optionally, the upper portion 33 of the I-shaped member, the middle portion 32 of the I-shaped member and the wall-shaped member 40 are formed in the same step.

Optionally, the substrate 10 includes a chip region and a periphery region, and the I-shaped member 30 and the wall-shaped member 40 are respectively disposed in the chip region and the periphery region.

Specifically, the first contact structure 13 is disposed in the chip region, and the second contact structure 14 is disposed in the periphery region. The first contact structure 13 and the second contact structure 14 do not communicate with each other, and the second contact structure 14 can surround the first contact structure 13 for a circle, and is configured to protect the first contact structure 13. It can be understood that the second contact structure 14 is in an annular shape. Exemplarily, the second contact structure 14 may be in an annular shape, an elliptical ring shape, a square ring shape or other polygonal ring shapes. The first contact structure 13 is disposed in the ring, for example, the first contact structure 13 is disposed in the ring center position.

The materials of the first contact structure 13 and the second contact structure 14 may be tungsten or tungsten alloy. In the embodiments of the present disclosure, the materials of the first contact structure 13 and the second contact structure 14 are both tungsten. In order to prevent the first contact structure 13 and the second contact structure 14 from being diffused into the substrate 10, the second blocking layer 15 is disposed on the side surfaces and the bottom surface of each of the first contact structure 13 and the second contact structure 14. The material of the second blocking layer 15 may be titanium or titanium nitride.

The I-shaped member 30 may be disposed on the chip region, and the bottom surface of the I-shaped member 30 is connected with the top surface of the first contact structure 13, so that the I-shaped member 30 is conducted with the first contact structure 13. The material of the I-shaped member 30 may be copper or copper alloy.

The I-shaped member 30 includes the bottom portion, the middle portion and the upper portion. The bottom portion 31 of the I-shaped member is directly connected with the first contact structure 13. The middle portion 32 of the I-shaped member is respectively connected with the bottom portion 31 of the I-shaped member and the upper portion 33 of the I-shaped member. The width of the middle portion 32 of the I-shaped member is smaller than the width of the bottom portion 31 of the I-shaped member and the width of the upper portion 33 of the I-shaped member, and the width of the upper portion 33 of the I-shaped member is not smaller than the width of the bottom portion 31 of the I-shaped member, so that the bottom portion 31 of the I-shaped member and the upper portion 33 of the I-shaped member have a greater contact area. The upper portion 33 and the middle portion of the I-shaped member may be integrally formed, for example, may be formed through a damascene process.

The wall-shaped member 40 may be a portion of the guard ring or seal ring of the chip and is disposed on the periphery region. The bottom surface of the wall-shaped member 40 is connected with the top surface of the second contact structure 14, so that the wall-shaped member 40 is connected with the second contact structure 14. The wall-shaped member 40 may surround the I-shaped member 30, the top surface of the wall-shaped member 40 is not lower than the top surface of the I-shaped member 30, and the bottom surface of the wall-shaped member 40 is not higher than the bottom surface of the I-shaped member 30. In the embodiments of the present disclosure, the bottom surface of the wall-shaped member 40 may be flushed with the bottom surface of the I-shaped member 30. Through such arrangement, the wall-shaped member 40 may surround the I-shaped member 30, and additionally, in a direction along the substrate 10 to the intermediate layer 20, the height of the wall-shaped member 40 is greater than or equal to the height of the I-shaped member 30, so that the I-shaped member 30 is disposed in the wall-shaped member 40.

The cross section shape of the wall-shaped member 40 may be a rectangular shape, and the width of the wall-shaped member 40 may be greater than the width of the middle portion 32 of the I-shaped member. For example, the width of the wall-shaped member 40 is equal to the width of the upper portion 33 of the I-shaped member.

The wall-shaped member 40 may be integrally formed to avoid delamination and to further avoid the occurrence of interlayer separation of the wall-shaped member 40, so that the structure is more stable and firmer, and the protection performance on the I-shaped member 30 can be improved. In the embodiments of the present disclosure, the wall-shaped member 40, the middle portion 32 of the I-shaped member and the upper portion 33 of the I-shaped member are formed simultaneously.

Continuously referring to FIG. 16, the third dielectric layer 50 is further formed on the intermediate layer 20, the third contact structure 51 and the fourth contact structure 52 are formed in the third dielectric layer 50. The third contact structure 51 and the fourth contact structure 52 penetrate through the third dielectric layer 50, and additionally, the third contact structure 51 and the fourth contact structure 52 are not conducted with each other. The fourth contact structure 52 may be disposed around the third contact structure 51, the third contact structure 51 is conducted with the I-shaped member 30, the fourth contact structure 52 is conducted with the wall-shaped member 40, and the materials of the third contact structure 51 and the fourth contact structure 52 may be tungsten or tungsten alloy.

It should be noted that the third blocking layer 53 may be disposed outside a part of the surfaces of the third contact structure 51 and the fourth contact structure 52, the third blocking layer 53 may be disposed with the reference to the second blocking layer 15, and the descriptions are omitted herein. The second etching stop layer 60 may also be disposed between the second dielectric layer 50 and the intermediate layer 20, and the third contact structure 51, the fourth contact structure 52 and the third blocking layer 53 can penetrate through the second etching stop layer 60 so as to be connected with the wall-shaped member 40 and the I-shaped member 30.

Continuously referring to FIG. 16, the semiconductor structure further includes the protection layer 80 disposed on the third dielectric layer 50, and the protection layer 80 includes the silicon oxide layer 81 and the silicon nitride layer 82. The silicon oxide layer 81 is disposed on the third dielectric layer 50, and the silicon nitride layer 82 is disposed on the silicon oxide layer 81.

The first connecting line 74 and the second connecting line 74 are disposed in the silicon oxide layer 81, the first connecting line 74 corresponds to the third contact structure 51, the second connecting line 75 corresponds to the fourth contact structure 52, and additionally, the first connecting line 74 and the second connecting line 75 are disposed at intervals. The regions respectively corresponding to the first connecting line 74 and the second connecting line 75 in the protection layer 80 respectively protrudes in a direction away from the third dielectric layer 50.

Each of the first connecting line 74 and the second connecting line 75 includes the fourth blocking layer 71, the metal layer 72 and the fifth blocking layer 73. The fourth blocking layer 71 is disposed on the third dielectric layer 50, the metal layer 72 is disposed on the fourth blocking layer 71, and the fifth blocking layer 73 is disposed on the metal layer 72.

Continuously referring to FIG. 16, the fourth blocking layer 71 is respectively in contact with the third contact structure 51 and the fourth contact structure 52. The material of the metal layer 72 may be aluminum or aluminum alloy, and the material of the fourth blocking layer 71 and the fifth blocking layer 73 may be titanium or titanium nitride.

The semiconductor structure in the embodiments of the present disclosure includes the substrate 10 and the intermediate layer 20 disposed on the substrate 10, the I-shaped member 30 and the wall-shaped member 40 are formed in the intermediate layer 20, the top surface of the wall-shaped member 40 is not lower than the top surface of the I-shaped member 30, and the bottom surface of the wall-shaped member 40 is not higher than the bottom surface of the I-shaped member 30. Through the wall-shaped member 40, the transfer of the stress from the side surfaces to the I-shaped member 30 can be reduced or prevented, or gas and liquid erosion on the I-shaped member 30 from the side surfaces can be reduced or prevented, so that the reliability of the semiconductor structure is improved.

Each embodiment or implementation described in this specification are described in an incremental manner, and with each embodiment being described with emphasis on differences from other embodiments, identical or similar parts throughout the various embodiments may take reference to each other.

Those skilled in the art will appreciate that in the disclosure of the present disclosure, the terms including "longitudinal", "transverse", "upper", "lower", "front", "rear", "left", "right", "vertical", "horizontal", "top", "bottom", "inner" and "outer" indicating the orientation or positional relationship are based on the orientation or positional relationship shown in the drawings for ease of description and simplicity of description of the present disclosure only, and are not intended to indicate or imply that the system or element referred to must have a particular orientation, be constructed and operate in a particular orientation, and therefore the above terms shall not be construed as limiting the present disclosure.

In the description of this specification, description with reference to terms including "one embodiment", "some embodiments", "illustrative implementations", "examples", "specific examples", or "some examples" means that a particular feature, structure, material, or characteristic described in combination with the embodiment or example is included in at least one embodiment or example of the present disclosure. In this specification, illustrative descriptions of the foregoing terms do not necessarily refer to the same embodiment or example. In addition, the described specific features, structures, materials, or characteristics may be combined in a proper manner in any one or more of the embodiments or examples.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without making the essence of the corresponding technical solutions depart from the scope of the technical solutions of the embodiments of the present disclosure.

What is claimed is:

1. A manufacturing method of a semiconductor structure, comprising:
   providing a substrate; and
   forming an intermediate layer on the substrate, wherein an I-shaped member and a wall-shaped member are formed in the intermediate layer,
   wherein a top surface of the wall-shaped member is not lower than a top surface of the I-shaped member, and a bottom surface of the wall-shaped member is not higher than a bottom surface of the I-shaped member;
   wherein an upper portion and a middle portion of the I-shaped member and the wall-shaped member are formed in one step, comprising:
   forming a first dielectric layer on the substrate;
   forming a bottom portion of the I-shaped member in the first dielectric layer;
   forming a second dielectric layer on the first dielectric layer and the bottom portion of the I-shaped member;
   forming a first photoresist layer with a first pattern and a second pattern on the second dielectric layer;
   etching the second dielectric layer by using the first pattern and the second pattern to respectively form a first initial opening and a second initial opening;
   forming a second photoresist layer with a third pattern and a fourth pattern on the second dielectric layer, wherein the third pattern exposes the first initial opening and a part of the second dielectric layer, and the fourth pattern exposes the second initial opening; and
   etching the part of the second dielectric layer by using the third pattern to form a first opening and etching the first dielectric layer by using the fourth pattern to form a second opening, wherein the first opening exposes the bottom portion of the I-shaped member, and the second opening penetrates through the second dielectric layer and extends to the first dielectric layer; and
   forming the middle portion and the upper portion of the I-shaped member in the first opening, and simultaneously forming the wall-shaped member in the second opening.

2. The manufacturing method of claim 1, wherein
   said etching the part of the second dielectric layer by using the third pattern to form the first opening and said etching the first dielectric layer by using the fourth pattern to form the second opening are performed in one step.

3. The manufacturing method of claim 1, further comprising: filling the first opening and the second opening with a conduction material to respectively form the upper portion and the middle portion of the I-shaped member and the wall-shaped member.

4. The manufacturing method of claim 1, wherein
   the substrate comprises a chip region and a periphery region, and the I-shaped member and the wall-shaped member are respectively disposed in the chip region and the periphery region.

5. The manufacturing method of claim 4, wherein the wall-shaped member is a portion of a guard ring or seal ring of the chip and the I-shaped member is a conduction interconnection structure in the chip region.

6. A semiconductor structure manufactured by the method of claim 1, comprising:
   the substrate;
   the intermediate layer disposed on the substrate; and
   the I-shaped member and the wall-shaped member, disposed in the intermediate layer.

7. The semiconductor structure of claim 6, wherein
   a width of the wall-shaped member is identical at the upper and lower sides, and the width of the wall-shaped member is greater than a width of the middle portion of the I-shaped member.

8. The semiconductor structure of claim 7, wherein
   the width of the wall-shaped member is equal to a width of the upper portion of the I-shaped member, and the width of the upper portion of the I-shaped member is not smaller than a width of the bottom portion of the I-shaped member.

9. The semiconductor structure of claim 6, wherein
   the substrate comprises a chip region and a periphery region, and the I-shaped member and the wall-shaped member are respectively disposed in the chip region and the periphery region.

10. The manufacturing method of claim 9, wherein the wall-shaped member is a portion of a guard ring or seal ring of the chip and the I-shaped member is a conduction interconnection structure in the chip region.

11. The semiconductor structure of claim 6, further comprising:
    a first contact structure and a second contact structure formed in the substrate, wherein the bottom portion of the I-shaped member is connected with the first contact structure, the wall-shaped member is connected with the second contact structure.

12. The semiconductor structure of claim 6, further comprising:
    a third contact structure and a fourth contact structure formed on the intermediate layer, wherein the third contact structure is connected with the upper portion of the I-shaped member, and the fourth contact structure is connected with the wall-shaped member.

13. The manufacturing method of claim 6, wherein the wall-shaped member surrounds the I-shaped member, and the height of the wall-shaped member is greater than or equal to the height of the I-shaped member.

14. The manufacturing method of claim 1, wherein
before the forming the second dielectric layer on the first dielectric layer, the manufacturing method further comprises:
forming a first etching stop layer on the first dielectric layer, and the first etching stop layer covering the bottom portion of the I-shaped member.

15. The manufacturing method of claim 1, wherein
after the forming the intermediate layer on the substrate, the manufacturing method further comprises:
forming a second etching stop layer on the intermediate layer, the second etching stop layer covering the wall-shaped member and the I-shaped member;
forming a third dielectric layer on the second etching stop layer;
etching the second etching stop layer and the third dielectric layer to form a third through hole exposing the I-shaped member and a fourth through hole exposing the wall-shaped member; and
forming a third contact structure and a fourth contact structure in the third through hole and the fourth through hole respectively, wherein the third contact structure is connected with the upper portion of the I-shaped member, and the fourth contact structure is connected with the wall-shaped member.

16. The manufacturing method of claim 15, further comprising:
forming a conduction layer on the third dielectric layer;
etching the conduction layer to form a first connecting line and a second connecting line, wherein the first connecting line is connected with the third contact structure, and the second connecting line is connected with the fourth contact structure; and
forming a protection layer covering the third dielectric layer, the first connecting line and the second connecting line.

17. The manufacturing method of claim 1, wherein the wall-shaped member surrounds the I-shaped member, and the height of the wall-shaped member is greater than or equal to the height of the I-shaped member.

18. The manufacturing method of claim 1, wherein
the wall-shaped member and the I-shaped member are made of metal, and a side surface and the bottom surface of each wall-shaped member and a side surface and the bottom surface of each I-shaped member is provided with a first blocking layer.

19. The manufacturing method of claim 1, wherein
a width of the upper portion of the I-shaped member is greater or equal to a width of the bottom portion of the I-shaped member, a width of the middle portion of the I-shaped member is the smallest; and
a width of the wall-shaped member is identical at the upper and lower sides, and the width of the wall-shaped member is greater than the width of the middle portion of the I-shaped member.

20. The manufacturing method of claim 1, wherein a first contact structure and a second contact structure are formed in the substrate, and the bottom portion of the I-shaped member is connected with the first contact structure, the wall-shaped member is connected with the second contact structure.

* * * * *